(12) United States Patent
Corbeij et al.

(10) Patent No.: US 8,482,718 B2
(45) Date of Patent: Jul. 9, 2013

(54) LITHOGRAPHIC APPARATUS AND DEVICE MANUFACTURING METHOD

(75) Inventors: Wilhelmus Maria Corbeij, Eindhoven (NL); Marcus Adrianus Van De Kerkhof, Helmond (NL); Haico Victor Kok, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 231 days.

(21) Appl. No.: 12/860,229

(22) Filed: Aug. 20, 2010

(65) Prior Publication Data

US 2011/0043780 A1    Feb. 24, 2011

Related U.S. Application Data

(60) Provisional application No. 61/235,562, filed on Aug. 20, 2009.

(51) Int. Cl.
*G03B 27/54* (2006.01)
*G03B 27/42* (2006.01)

(52) U.S. Cl.
USPC .............................. 355/67; 355/53

(58) Field of Classification Search
USPC .......... 355/52, 53, 55; 250/548; 356/399–401
See application file for complete search history.

(56) References Cited

U.S. PATENT DOCUMENTS

| | | | |
|---|---|---|---|
| 4,849,313 A | 7/1989 | Chapman et al. | |
| 4,971,444 A * | 11/1990 | Kato | 356/401 |
| 5,017,514 A | 5/1991 | Nishimoto | |
| 5,402,224 A | 3/1995 | Hirukawa et al. | |
| 5,572,288 A * | 11/1996 | Mizutani | 355/53 |
| 5,581,324 A | 12/1996 | Miyai et al. | |
| 6,897,938 B2 * | 5/2005 | Tanaka et al. | 355/53 |
| 7,359,029 B2 * | 4/2008 | Finders et al. | 355/30 |
| 7,545,480 B2 * | 6/2009 | Lee | 355/53 |
| 7,675,605 B2 | 3/2010 | Moest | |
| 2003/0133099 A1 | 7/2003 | Shiode | |
| 2006/0055904 A1 | 3/2006 | Baselmans | |
| 2006/0058972 A1 | 3/2006 | Kok et al. | |
| 2006/0119823 A1 | 6/2006 | Hirukawa et al. | |
| 2006/0268254 A1 | 11/2006 | Percin et al. | |
| 2007/0260419 A1 | 11/2007 | Hagiwara | |
| 2009/0002710 A1 | 1/2009 | Moest | |
| 2009/0153830 A1 | 6/2009 | Kok | |

FOREIGN PATENT DOCUMENTS

| | | |
|---|---|---|
| CN | 101344731 | 1/2009 |
| JP | 4-127514 | 4/1992 |
| JP | 2008-034537 | 2/2008 |

(Continued)

OTHER PUBLICATIONS

Chinese Office Action dated Mar. 31, 2012 in corresponding Chinese Patent Application No. 201010262288.1.

(Continued)

*Primary Examiner* — Hung Henry Nguyen
(74) *Attorney, Agent, or Firm* — Pillsbury Winthrop Shaw Pittman LLP (57) ABSTRACT

Disclosed is a method of determining higher order distortions of a patterning device of a lithographic apparatus, and associated apparatus. The higher order distortions are measured using the transmission imaging device. In a main embodiment, enhanced reticles are used which may have additional alignment gratings in the perimeter, in the scribe lanes of the image field or in the image field itself.

16 Claims, 4 Drawing Sheets

FOREIGN PATENT DOCUMENTS

| | | |
|---|---|---|
| JP | 2008-166482 | 7/2008 |
| JP | 2009-147332 | 7/2009 |
| WO | 2006/009188 | 1/2006 |

OTHER PUBLICATIONS

Japanese Office Action mailed Feb. 24, 2012 in corresponding Japanese Patent Application No. 2010-181988.

Japanese Office Action mailed Feb. 23, 2012 in corresponding Japanese Patent Application No. 2010-181989.

U.S. Office Action mailed Aug. 7, 2012 in corresponding U.S. Appl. No. 12/727,054.

\* cited by examiner

Fig. 1

-- PRIOR ART --

Fig. 2

-- PRIOR ART --

LITHOGRAPHIC APPARATUS AND DEVICE MANUFACTURING METHOD

CROSS-REFERENCE TO RELATED APPLICATION

This application claims priority and benefit under 35 U.S.C. §119(e) to U.S. Provisional Patent Application No. 61/235,562, entitled "Lithographic Apparatus and Device Manufacturing Method," filed on Aug. 20, 2009. The content of that application is incorporated herein in its entirety by reference.

FIELD

The present invention relates to a lithographic apparatus, a patterning device for use with such a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In present lithographic apparatus, a device for transmission image detection is used in order to align a reticle to a wafer stage. It consists of a structure (e.g. a grating) on a reticle and a complementary structure on a transmission image detector plate. The image of the structure is scanned using the transmission image detector to determine position and focus of the image. The transmission image detector has a small number (typically 4-8) of such structures. Beneath each structure a photodiode is located to detect the light. The transmission image detector is conventionally used to measure first-order positioning terms like translation, magnification and rotation of the reticle with respect to the wafer stage. Higher order distortions remain unresolved. Such higher order distortions may arise as a consequence of reticle heating and/or lens heating. Any distortions, including these higher order distortions may lead to overlay errors. For high throughput machines these higher order distortions will become one of the largest posts in the overlay budget.

In device manufacturing methods using lithographic apparatus, overlay is an important factor in the yield, i.e. the percentage of correctly manufactured devices. Overlay is the accuracy within which layers are printed in relation to layers that have previously been formed. The overlay error budget will often be 10 nm or less, and to achieve such accuracy, the substrate must be aligned to the mask pattern to be transferred with great accuracy.

SUMMARY

It is desirable to reduce the impact of overlay errors resultant from reticle or lens heating.

According to an aspect of the invention, there is provided a lithographic apparatus arranged to transfer a pattern from a patterning device onto a substrate, wherein said apparatus is operable to measure higher order distortions and/or image plane deviations of the patterning device, said apparatus comprising a device for transmission detection; and a processor arranged to model higher order distortions of the patterning device using signals received from the transmission image detector; wherein said patterning device has a main imaging field, and a perimeter and said apparatus is operable to model said higher order distortions using signals resultant from alignment structures comprised in at least three sides of said perimeter and/or in the image field.

According to an aspect of the invention, there is provided a method of determining higher order distortions of a patterning device of a lithographic apparatus, said method comprising: creating a radiation beam; imparting the radiation beam with a pattern in its cross-section to form a patterned radiation beam using a patterning device, said patterning device comprising a main imaging field, a perimeter and a plurality of alignment structures; detecting transmission of radiation transmitted through said alignment structures of said patterning device and into a device for transmission detection, producing measurement signals from the detected radiation, and determining higher order distortions and/or image plane deviations of said patterning device using measurement signals resultant from radiation transmitted through alignment structures comprised in at least three sides of said perimeter and/or in the image field.

According to an aspect of the invention, there is provided a patterning device for use in a lithographic apparatus, said patterning device having a main imaging field, and a perimeter wherein said patterning device is provided with additional alignment structures for the improved measurement of distortion and/or field plane deviations of said patterning device.

Other features of the invention are as described in the appended claims.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
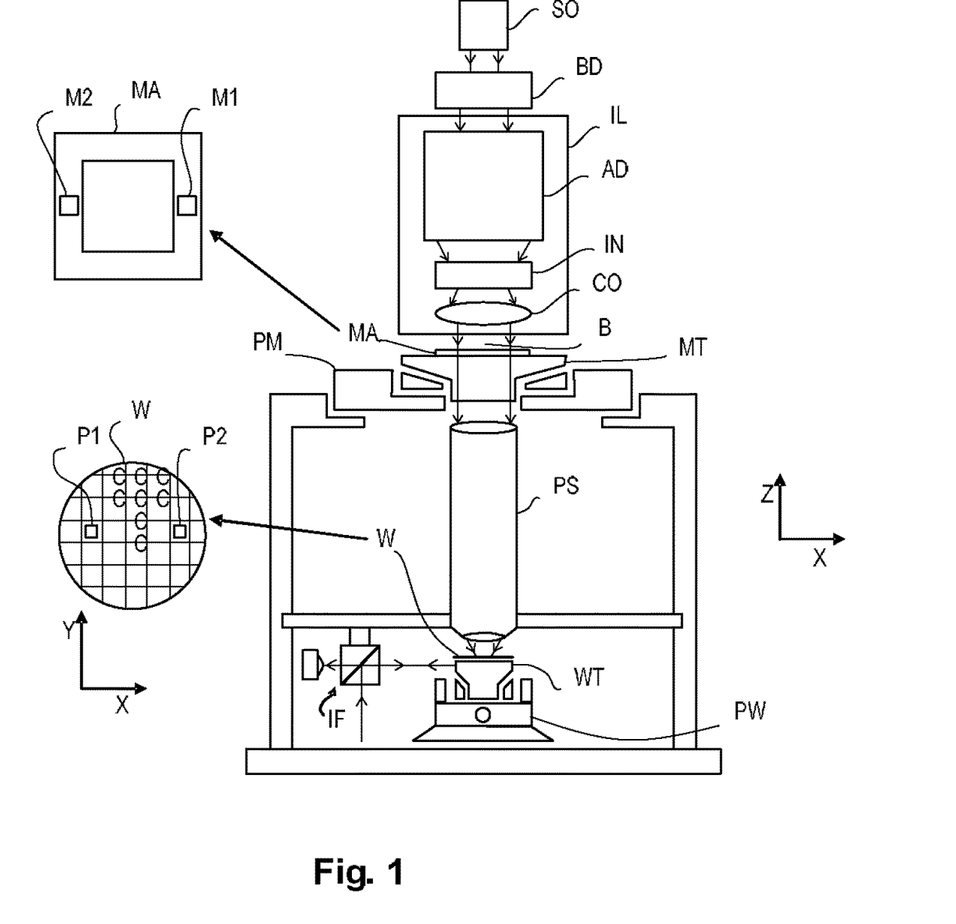
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation, DUV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
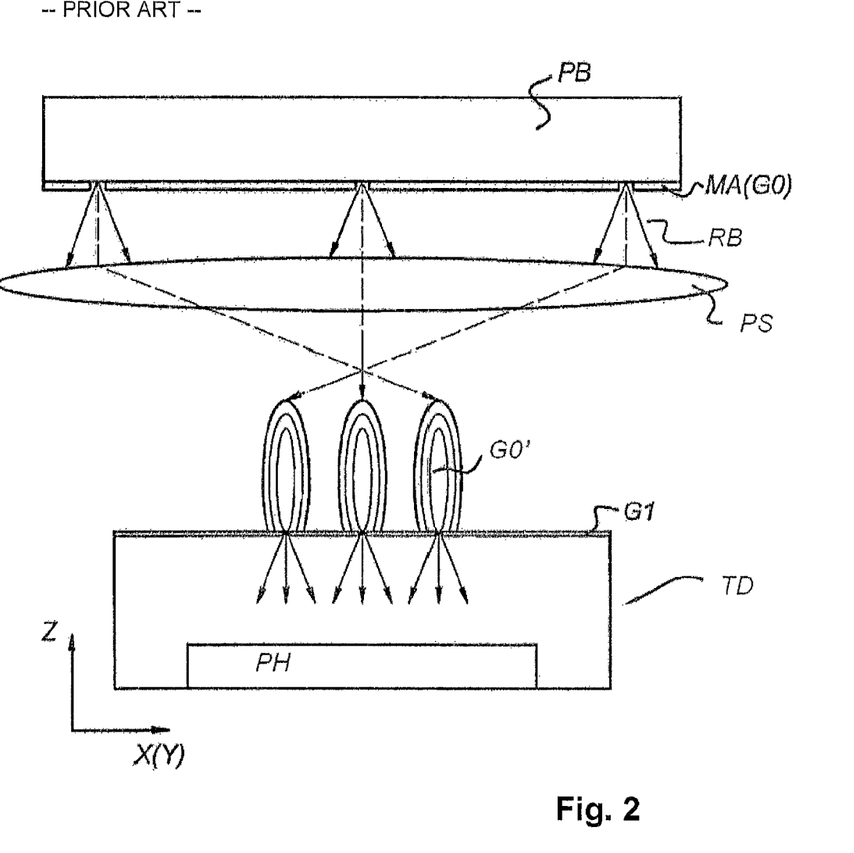
FIG. 2 depicts schematically a transmission image detector according to the state of the art.

FIG. 2 depicts schematically a device for transmission image detection, also referred to as a transmission image detector or transmission image sensor. A transmission image detector per se is known from the prior art. The projection beam PB is incident on a first object G0 for example a grating in the mask MA. The first grating G0 comprises a plurality of openings arranged for creating an image from the projection beam PB. The openings in the first grating G0 each emit a radiation beam originating from the projection beam PB. The radiation beams emitted by the plurality of openings in G0, pass through a lens for example, the projection lens system PS. The optical properties of such projection lens system are such that an image of G0, G0', is formed at a given plane below the projection lens system PS. The transmission image detector TD is positioned below the projection lens system PS. The transmission image detector TD comprises a slot pattern G1 and a photo sensor PH device. The slot pattern G1 is an opening over the photo sensor PH device which has the shape of a slit or a square. Advantageously, applying a pattern on the opening over the photo sensor PH device increases the number of edges which may increase the signal level and thus the signal/noise ratio of the photo sensor PH.

The transmission image detector TD is arranged on the substrate table WT, see FIG. 1. The transmission image detector TD allows accurate positioning of the wafer relative to the position of the projection lens system PS and the mask MA in three orthogonal directions X, Y, and Z. By scanning along these three directions the intensity of the image G0' can be mapped as a function of the XYZ position of the transmission image detector, for example in an image map (a 3D map), which comprises the coordinates of sampling locations and the intensity sampled at each location. From the 3D map, a computer or processor connected to the transmission image detector TD can derive the position of the image by using for example a parabolic fit of the top position using a least squares fitting method.

One issue with the above apparatus, in use, which should be taken into account is that if mask MA (or reticle) heating. The mask MA at the position of its image field will heat up due to absorption of radiation. The area outside this image field will remain relatively cool. This will cause distortion and bending of the mask MA. This distortion and bending cannot be measured with only two measurement positions in the field.

Figure 3:
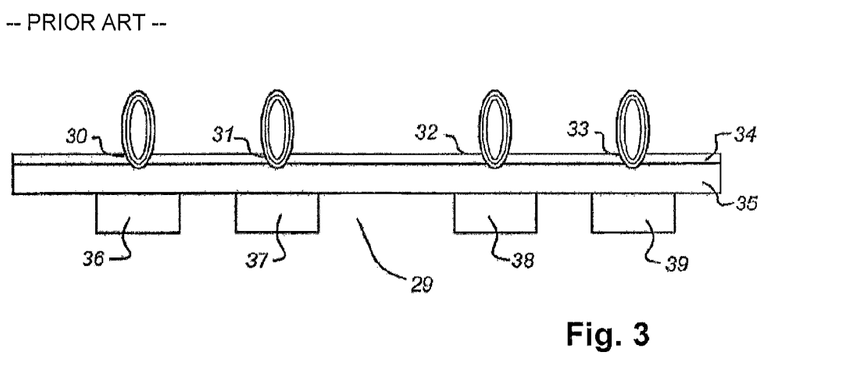
FIG. 3 shows an example of a transmission image detector according to the state of the art.

FIG. 3 shows an example of a transmission image detector 29 according to the state of the art with 4 gratings 30, 31, 32, 33 in a litho layer 34. The litho layer 34 is manufactured on a quartz window 35. Beneath each of the gratings 30, 31, 32, 33 an associated photodiode 36, 37, 38, 39 is provided. Using only 4 measurement positions in the corners of the image field, as is standard, means that the transmission image detector 29 can only measure zero- and first-order terms like translation, magnification, rotation, focus and focus tilt of the reticle with respect to the wafer stage. Higher order distortions, defined as some or all distortions of some or all polynomial orders above 1 (quadratic, cubic, etc), generally remain undetected because these generally require more independent measurement positions in or around the image field. Such higher order distortions may arise as a consequence of reticle heating and/or lens heating and may increase the overlay errors.

Instead of measuring just a small number of measurement positions in the corners of the image field the transmission image detector may be used to measure the actual reticle deformation locally to reduce the overlay errors. Dependent on the required accuracy of the measured overlay errors, the number of measurement positions to measure the actual reticle deformation locally, with a transmission image detector, may be adjusted. The locally measured values can be put in a matrix and by using a feed-forward model, the deformation behaviour of a reticle, including higher order distortions, can be predicted so that smaller overlay errors can be obtained. This feed-forward model is an extension to the known 'basic' Reticle Align (RA) model with additional XY inputs. By using more measured independent inputs, this model is less sensitive to model assumptions than the known 'basic' Reticle Align (RA) model.

The model may comprise a third order model with dX and dY terms as a function of X and Y, which means that 20 parameters are needed for a full decomposition, which in turn requires 20 independent measurements to avoid an underdetermined system. In practice, some parameters (or terms) can be skipped or modeled from other parameters, reducing the required input measurements. However it is still preferable to have dX,dY measurements both along the top/bottom (function of X) and left/right (function of Y) sides.

In practice a third-order model is most practicable due to the correction potential of the machine (and the number of available independent input measurements, and noise propagation considerations), but this is not fundamental and in some cases (e.g. when the load is highly asymmetric) or in the future, it may indeed be worthwhile to include some fifth-order terms or higher.

When the model is extended with additional XY inputs, the additional gratings to be measured at reticle level may be surrounded by very small chrome borders (e.g. as in scribelanes) or even no chrome borders at all. In these cases spurious effects due to the limited or missing chrome borders for the intra-field gratings may occur and these effects should be suppressed. In these cases it can be advantageous to only use standard RA gratings for the actual first reticle align, while measuring and storing/calibrating the intra-field gratings for subsequent delta measurements/corrections. In such a scenario, a lower order correction model, using only the standard RA gratings, would be used for the first reticle align, while for subsequent wafers a relative higher order correction model can be applied, using the standard RA grating measurements in an absolute manner plus the additional XY grating measurements relative to the first reticle align.

Figure 4:
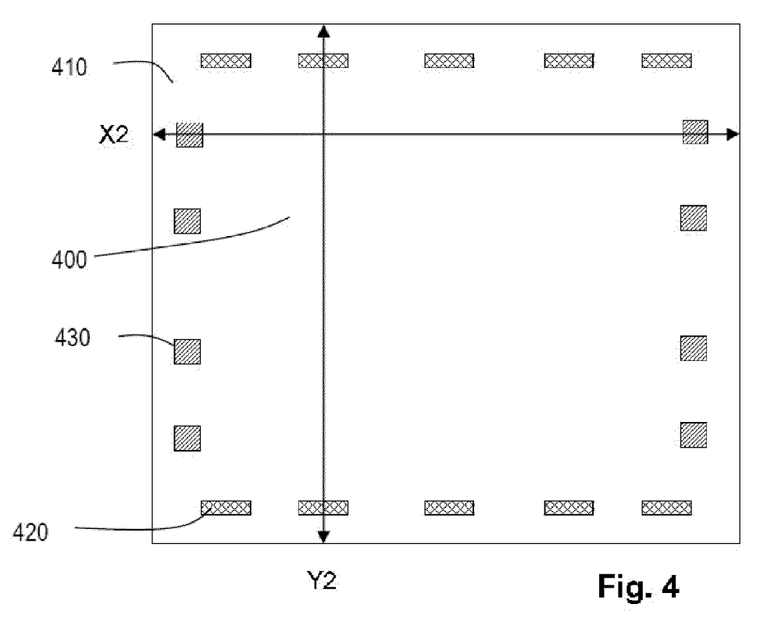
FIG. 4 shows an example of a reticle that may be used with the transmission image detector of FIGS. 2 and 3.

FIG. 4 shows a standard reticle that is currently used in conjunction with a transmission image detector in an apparatus such as shown in FIG. 1. The standard reticle has an image field 400 and a perimeter 410. The perimeter 410 is provided with four sets of x and y gratings 420, one in each corner, with further x and y gratings 420 along the top and bottom and a number of single direction gratings 430 along the sides. Conventionally the corner gratings are used for basic alignment, while the other gratings are used in reticle shape correction for determining image plane deviation.

According to a first embodiment of the invention, the reticle of FIG. 4 can be used in this standard form with the apparatus depicted in FIGS. 1 and 2, and using the extended feed forward model described above, for the calculation of local reticle deformation. In particular, the use of gratings on all four sides (as opposed to just the top and bottom) of the reticle means that higher order distortions, particularly in terms of y, can be calculated.

Figure 5:
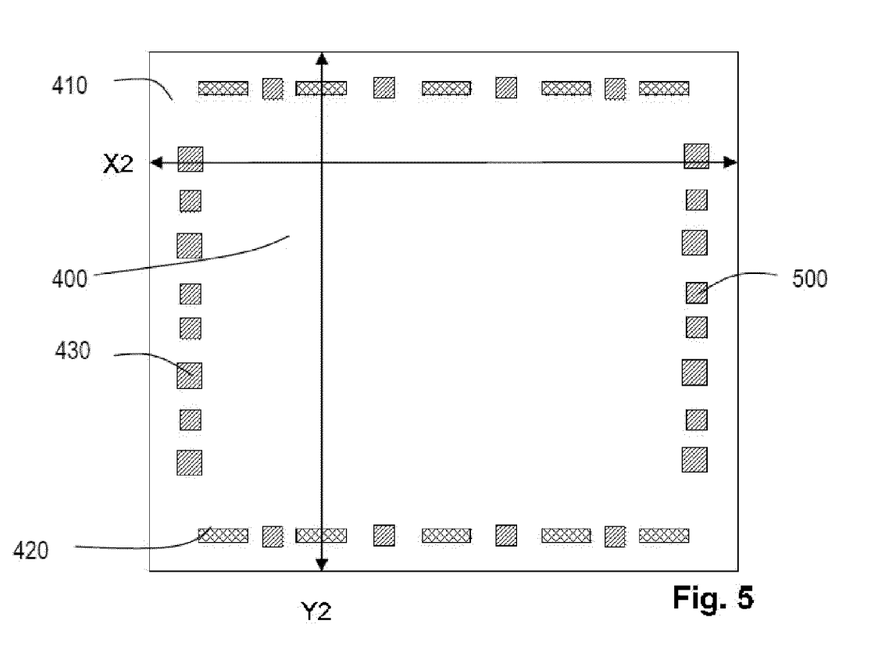
FIG. 5 shows an example of a first enhanced reticle that may be used with the transmission image detector of FIGS. 2 and 3.

FIG. 5 shows an enhanced reticle. One drawback with the standard reticle is that the gratings found along the left and right hand sides are "y-gratings" which are designed to perform measurements along the y-axis. While this is useful, measurement along the x-axis would be better, due to the nature of the distortion, which tends to distort more in the middle of the sides as opposed to the corners (barrel distortion). Consequently, another embodiment uses a reticle, as shown in FIG. 5, with additional "x-gratings" 500 along each side, as well as along the top and bottom. This allows for a more extensive modeling of higher order terms in x.

Figure 6:
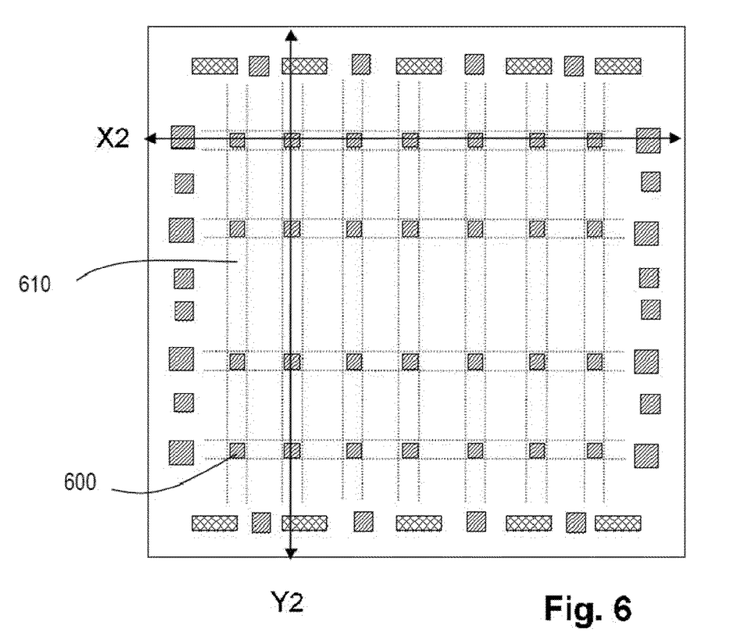
FIG. 6 shows an example of a second enhanced reticle that may be used with the transmission image detector of FIGS. 2 and 3.

FIG. 6 shows a further enhanced reticle having a matrix of gratings 600 which is provided in the image field itself. So as not to interfere with the image, it is proposed that the best place to locate these image field gratings is in the scribe lanes 610, as shown. This enhanced reticle allows for the production of a denser matrix to allow for more accurate local corrections. When using this reticle, not only can a more detailed third-order model be achieved, but also higher order modeling of dx and dy, as a function of both x and y, with a polynomial order depending on the overlay issue and/or correction potential, including x-y crossterms, is achievable.

Figure 7:
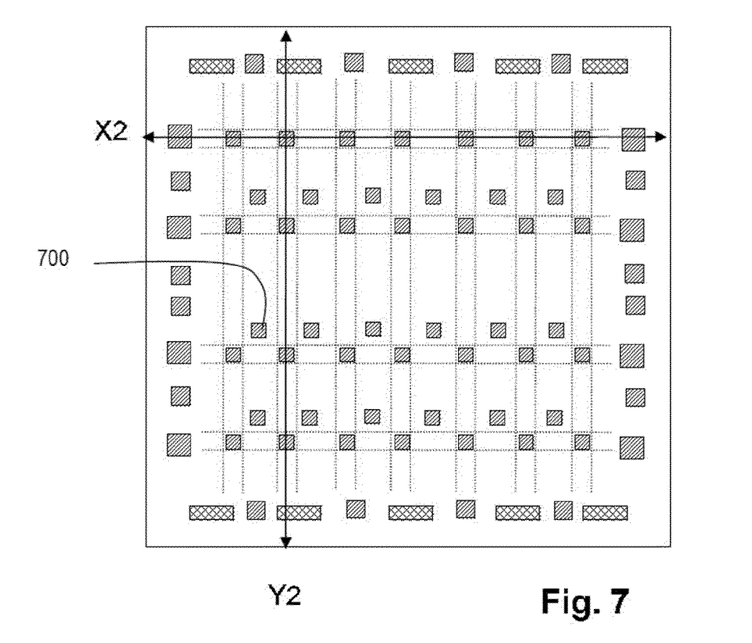
FIG. 7 shows an example of a third enhanced reticle that may be used with the transmission image detector of FIGS. 2 and 3.

FIG. 7 shows an enhanced reticle with a matrix of gratings 600 in the image field scribe lanes 610, and further gratings 700 in the image field 410 outside of the scribe lanes. This is possible particularly where the image is known, in which case the gratings can be placed anywhere in the image field that does not interfere with the image itself.

The scan should preferably be done during regular transmission image detector alignment to minimize the impact on throughput. In each case, the transmission image detector, as already described, comprises four gratings arranged on a litho layer (It is within the scope of the invention to use an improved transmission image detector, with an increased number of gratings, to increase throughput). The gratings are positioned so as to receive an image produced by the standard RA gratings on the reticle placed on the mask table MT of the lithographic apparatus, see FIG. 1. The transmission image detector further comprises radiation sensitive sensors arranged to receive radiation coming through one of the gratings and to produce a measurement signal. The litho layer may for example be a chrome layer patterned with a plurality of gratings arranged in a row. The measurement signals are input to a processing device which is arranged to determine higher order distortions of the projection system (i.e. the lens) and/or of the patterning device. These distortions can be used to adjust the components of the lithographic apparatus, but they can also be used to improve alignment of the substrate table relative to the patterning device.

While the above techniques have described the use of alignment gratings, the skilled person will appreciate that any alignment marks, patterns or structures may be used without departing from the scope of the invention. Furthermore the number and arrangement of the alignment marks and scribe lanes and the general arrangement of the reticles may differ significantly from the purely illustrative examples shown. Also, by adding more chrome around the gratings to reduce stray light, accuracy can be improved.

It should be noted that any type of image sensor or image detector may be used, and is not necessarily be limited to the transmission image detector as described. For example a wavefront detector or interferometer may be used. Also, improvements can be made to the transmission image detector such as improving the fitting algorithms to better deal with a varying signal environment.

Note that the above description considers only the overlay terms. However, as the transmission image detector also yields focus results every scan, the disclosed concept can also be applied as an extension of reticle shape correction. This extension can be in the spatial domain by adding additional focus measurement points, or in the temporal domain by tracking changes in reticle shape correction over time (e.g. due to reticle heating).

Furthermore the above techniques can also be used to measure image plane deviations caused by the inadequate flatness of the wafer table.

It should be noted that the above techniques do not have to be performed for every wafer, as this would result in a throughput penalty that might be too great to be practical. Instead these measurements can be performed only once for a predetermined number of wafers, the number depending on the error range of the calculating/modeling software, which increases between recalibration. Alternatively, these measurements could be done off-line. In each case the results can be stored for further usage.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, features of the invention, such as those for processing, may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims based on this disclosure.

To summarise, the present disclosure includes one or more of the following features:

A lithographic apparatus arranged to transfer a pattern from a patterning device onto a substrate, wherein the apparatus is operable to measure higher order distortions and/or image plane deviations of the patterning device, the apparatus including a device for transmission detection and a processor configured and arranged to model higher order distortions of the patterning device using signals received from the device for transmission detection, wherein the patterning device has a main imaging field, and a perimeter and the apparatus is operable to model the higher order distortions using signals resultant from alignment structures comprised in at least three sides of said perimeter and/or in the image field.

A lithographic apparatus as described above, wherein the device for transmission detection includes a transmission image detector.

A lithographic apparatus as described above, wherein the transmission image sensor includes a plurality of alignment structures and a plurality of radiation sensitive sensors such that the radiation is also transmitted through the alignment structures of the device for transmission detection and is received by said radiation sensitive sensors so as to produce measurement signals.

A lithographic apparatus as described above, wherein the device for transmission detection includes an interferometer.

A lithographic apparatus as described above, further including an illumination system configured to condition a radiation beam, a patterning device, the patterning device being capable of imparting the radiation beam with a pattern in its cross-section to form a patterned radiation beam, a substrate table constructed to hold a substrate, the device for transmission detection being arranged on the substrate table, and a projection system configured to project the patterned radiation beam onto a target portion of the substrate.

A lithographic apparatus as described above, wherein the patterning device is provided with additional alignment structures for the improved measurement of distortion of the patterning device.

A lithographic apparatus as described above, wherein at least some of said additional alignment structures are provided in said perimeter of said patterning device, said structures for extended modeling of alignment in the x or y direction.

A lithographic apparatus as described above, wherein at least some of the additional alignment structures are included within the image field of the patterning device.

A lithographic apparatus as described above, wherein the main imaging field is divided by scribe lanes and at least some of the additional alignment structures included within the image field are included within said scribe lanes of the patterning device.

A lithographic apparatus as described above, wherein the additional alignment structures include structures for focus measurement.

A lithographic apparatus as described above, wherein the apparatus is operable to perform extended modeling of focus terms or image plane deviations.

A lithographic apparatus as described above, wherein the apparatus is operable to track shape correction of the patterning device over time.

A lithographic apparatus as described above, wherein the device for transmission detection is a conventional device having fewer than ten alignment structures.

A lithographic apparatus as described above that is operable such that higher order distortions and/or image plane deviations are determined only once for a predetermined number of wafers, and stored for future reference.

A lithographic apparatus as described above that is operable such that higher order distortions and/or image plane deviations are determined while the apparatus is off-line, and stored for future reference.

A lithographic apparatus as described above that is operable to determine higher than third order distortions.

A method of determining higher order distortions of a patterning device of a lithographic apparatus, including imparting a radiation beam with a pattern in its cross-section to form a patterned radiation beam using a patterning device, the patterning device comprising a main imaging field, a perimeter and a plurality of alignment structures, detecting transmission of radiation transmitted through the alignment structures of the patterning device and into a device for transmission detection, producing measurement signals from the detected radiation, and determining higher order distortions and/or image plane deviations of said patterning device using measurement signals resultant from radiation transmitted through alignment structures comprised in at least three sides of the perimeter and/or in the image field.

A method as described above, wherein the device for transmission detection comprises fewer than ten alignment structures.

A method as described above, wherein a patterning device is used that has additional alignment structures along its sides for extended modeling of alignment in the x or y direction, the additional alignment structures being additional to the standard structures needed for basic lower order alignment.

A method as described above, wherein a patterning device is used that has additional alignment structures included within its image field.

A method as described above, wherein at least some of the additional alignment structures comprised within the image field are included within scribe lanes of the patterning device.

A method as described above, wherein the additional alignment structures include those for focus measurements, the method including extended modeling of focus terms or image plane deviations as well as tracking shape correction of the patterning device over time.

A method as described above, wherein the determining step is done only once for a predetermined number of wafers, as is the detecting step other than for normal alignment purposes.

A method as described above, wherein the determining step is done while off-line, as is the detecting step other than for normal alignment purposes.

A method as described above, wherein the device for transmission detection includes a plurality of alignment structures and a plurality of radiation sensitive sensors such that the radiation is also transmitted through the alignment structures of the device for transmission detection and is received by the radiation sensitive sensors so as to produce measurement signals.

A method as described above, wherein higher than third order distortions are determined.

A patterning device for use in a lithographic apparatus, including, but not limited to any of the above-described lithographic apparatuses, the patterning device having a main imaging field, and a perimeter wherein the patterning device is provided with additional alignment structures for the improved measurement of distortion and/or image plane deviations of the patterning device.

A patterning device as described above wherein at least some of the additional alignment structures are provided in the perimeter, the structures being structured and positioned for extended modeling of alignment, and being in addition to the standard structures needed for basic lower order alignment.

A patterning device as described above, wherein at least some of the additional alignment structures are included within its image field.

A patterning device as described above, wherein the image field is divided by scribe lanes and at least some of the additional alignment structures included within the image field are included within the scribe lanes of the patterning device.

A patterning device as described above, wherein the additional alignment structures include those for focus measurements.

A patterning device as described above, wherein the additional alignment structures include additional chrome around their borders.

An alignment apparatus including any of the patterning devices as described above.

A microcircuit device manufactured with a patterning device, a lithographic apparatus, or in accordance with a method described above.

A machine-readable medium encoded with machine-executable instructions for performing a method as described above, or for controlling a lithographic apparatus or an alignment apparatus as described above.

While in the foregoing specification this invention has been described in relation to certain preferred embodiments thereof, and many details have been set forth for purpose of illustration, it will be apparent to those skilled in the art that the invention is susceptible to alteration and that certain other details described herein can vary considerably without departing from the basic principles of the invention. In addition, it should be appreciated that structural features or method steps shown or described in any one embodiment herein can be used in other embodiments as well.

The invention claimed is:

1. A lithographic apparatus arranged to transfer a pattern from a patterning device onto a substrate, wherein said apparatus is operable to measure at least one distortion selected from the group consisting of: third order distortions or image plane deviations of the patterning device, said apparatus comprising:
   a device for transmission detection; and
   a processor configured and arranged to model higher order distortions of the patterning device using signals received from the device for transmission detection;
   wherein said patterning device has a main imaging field, and a perimeter and said apparatus is operable to model said higher order distortions using signals resultant from alignment structures comprised in at least three sides of said perimeter and in the image field;
   wherein the alignment structures in the perimeter comprise gratings for measurement along an x-axis and gratings for measurement along a y-axis and alignment structures in the image field comprise a matrix of gratings disposed in scribe lines of the image field,
   the processor being further configured and arranged to perform a first reticle alignment using the alignment structures in the perimeter and to perform subsequent reticle alignments using the alignment structures in the scribe lines of the image field in conjunction with the alignment structures in the perimeter.

2. A lithographic apparatus as claimed in claim 1 wherein said device for transmission detection comprises a transmission image detector.

3. A lithographic apparatus as claimed in claim 2 wherein said transmission image sensor comprises a plurality of alignment structures and a plurality of radiation sensitive sensors such that said radiation is also transmitted through said alignment structures of said device for transmission detection and is received by said radiation sensitive sensors so as to produce measurement signals.

4. A lithographic apparatus as claimed in claim 1 wherein said device for transmission detection comprises an interferometer.

5. A lithographic apparatus as recited in claim 1, further comprising:
- an illumination system configured to condition a radiation beam;
- a patterning device, the patterning device being capable of imparting the radiation beam with a pattern in its cross-section to form a patterned radiation beam;
- a substrate table constructed to hold a substrate, said device for transmission detection being arranged on said substrate table; and
- a projection system configured to project the patterned radiation beam onto a target portion of the substrate.

6. A lithographic apparatus as recited in claim 1, wherein said patterning device is provided with additional alignment structures for an improved measurement of distortion of said patterning device.

7. A lithographic apparatus as recited in claim 6 wherein, at least some of said additional alignment structures are provided in said perimeter of said patterning device, said structures for extended modeling of alignment in the x or y direction.

8. A lithographic apparatus as recited in claim 1, wherein said additional alignment structures include structures for focus measurement.

9. A lithographic apparatus as recited in claim 1, that is operable such that the measured at least one distortion is determined only once for a predetermined number of wafers, and stored for future reference.

10. A lithographic apparatus as recited in claim 1, that is operable such that the measured at least one distortion is determined while said apparatus is off-line, and stored for future reference.

11. A method of determining higher order distortions of a patterning device of a lithographic apparatus, said method comprising:
- imparting a radiation beam with a pattern in its cross-section to form a patterned radiation beam using a patterning device, said patterning device comprising a main imaging field, a perimeter and a plurality of alignment structures;
- detecting transmission of radiation transmitted through said alignment structures of said patterning device and into a device for transmission detection,
- producing measurement signals from the detected radiation, and
- determining at least one distortion selected from the group consisting of:
  - third order distortions or image plane deviations of said patterning device using measurement signals resultant from radiation transmitted through alignment structures comprised in at least three sides of said perimeter and/or in the image field
- wherein the alignment structures in the perimeter comprise gratings for measurement along an x-axis and gratings for measurement along a y-axis and alignment structures in the image field comprise a matrix of gratings disposed in scribe lines of the image field;
- and wherein the determining further comprises:
  - performing a first reticle alignment using the alignment structures in the perimeter; and
  - performing at least one subsequent reticle alignment using the alignment structures in the scribe lines of the image field in conjunction with the alignment structures in the perimeter.

12. A method as claimed in claim 11 wherein a patterning device is used that has additional alignment structures along its sides for extended modeling of alignment in the x or y direction, said additional alignment structures being additional to the standard structures needed for basic lower order alignment.

13. A method as recited in claim 11, wherein a patterning device is used that has additional alignment structures comprised within its image field.

14. A method as recited in claim 11 wherein said additional alignment structures include those for focus measurements, the method including extended modeling of focus terms or image plane deviations as well as tracking shape correction of said patterning device over time.

15. A lithographic apparatus as in claim 1, wherein the processor is further configured and arranged to perform the subsequent alignment using the first alignment as a first order correction and information derived from the alignment structures in the image fields as a third order measurement relative to the first order correction.

16. A method as in claim 11, wherein the subsequent alignment is performed by using the first alignment as a first order correction and by applying a third order correction based on measurements derived from the alignment structures in the image fields.

* * * * *